United States Patent [19]

Miyakawa et al.

[11] Patent Number: 4,665,505

[45] Date of Patent: May 12, 1987

[54] WRITE CIRCUIT FOR USE IN SEMICONDUCTOR STORAGE DEVICE

[75] Inventors: Nobuaki Miyakawa, Ibaraki; Yoshiaki Yazawa; Shoichi Ozeki, both of Hitachi; Kinya Mitsumoto, Koganei, all of Japan

[73] Assignees: Hitachi, Ltd.; Hitachi Haramachi Semi-Conductor Ltd., both of Japan

[21] Appl. No.: 685,552

[22] Filed: Dec. 24, 1984

[30] Foreign Application Priority Data

Dec. 26, 1983 [JP] Japan .................................. 58-249710

[51] Int. Cl.⁴ ............................................. G11C 11/40
[52] U.S. Cl. .................................... 365/177; 365/189; 365/190; 357/43

[58] Field of Search ....................... 365/177, 189, 190; 357/43

[56] References Cited

FOREIGN PATENT DOCUMENTS 56-58193  5/1981  Japan .

*Primary Examiner*—Terrell W. Fears
*Attorney, Agent, or Firm*—Antonelli, Terry & Wands

[57] ABSTRACT

A write circuit for a semiconductor storage device which comprises a data output stage constructed by a composite circuit including at least one MOS transistor logic circuit and bipolar transistor. The Mos transistor circuit operates in response to an input signal to control the on-off states of at least one of the bipolar transistors. The write circuit implements less power consumption.

23 Claims, 8 Drawing Figures

WRITE CIRCUIT FOR USE IN SEMICONDUCTOR STORAGE DEVICE

BACKGROUND OF THE INVENTION

This invention relates to a write circuit for a semiconductor storage or memory device in which bipolar elements and MOS transistors are mixed.

The conventional write circuit for a high speed semiconductor storage device is usually of a bipolar contruction and an emitter follower type. The emitter follower type of circuit, however, requires a bias current flow because of the concern that an output terminal will be in the floating state. This leads to the increase of power consumption in a standby state. Particularly, the implementation of a large bit storage device further increases the power consumption since it is usually accompanied by the increase of the number of the write circuits. Relative to a sense circuit, in order that it will not be saturated by the output from the write circuit, there must be provided some means such as adding a bias power source in the write circuit, and controlling the relation between the power source and the saturation of the sense circuit.

In order to clarify the entire construction of the conventional semiconductor storage device, the block diagram thereof is shown in FIG. 1. In the figure, $A_1$ is an input terminal for control signal such as an address signal, a chip select signal and a write control signal. For example, in the case of 16K memory, 14 address signal lines are provided, while in the case of 64K memory, 16 address signal lines are provided. As for the other signals, two or more lines are provided therefor in both cases. Character $D_1$ designates an input terminal of a write signal which is written or stored in the memory cell selected by the address signal.

Numeral 1 is an input buffer circuit for inputting the signals for selecting the columns of memory cells arranged in a matrix shape, among the above mentioned control signals; 2 is a decoder for decoding the output signal from the input buffer circuit 1 to select one of the columns; 3 is a driver circuit for driving the output signal from the decoder 2 to drive the columns of large load capacitance; $W_k$ is a word line corresponding to a k-th column, 5 is a memory cell selected by the word line $W_k$; Cn, Ca are a data line for input/output of a read/write signal for the memory cell, respectively; 6 is an input buffer circuit for inputting the signals for selecting the rows of the memory cell matrix; 7 is a decoder for decoding the output signal from the input buffer circuit 6 to select one of the rows; $e_l$ designates a signal on the l-th row selected by the decoder 7; $Y_m$, $Y_n$ are switches selected by the signal $e_l$, respectively; a, b are common data lines for outputting the read/write signal for the data of the memory cell through the switches $Y_m$, $Y_n$, respectively; 9 is a sense circuit for detecting the data of the memory cell 5 from the signals on the common data lines a, b; 10 is an output buffer circuit 9 for outputting the output signal from the sense circuit 9 to an external circuit; $D_0$ is an output signal; $D_1$ is a write signal; and 8 is a write circuit for outputting the write signal into the common data lines a, b. Incidentally, the explanation about the above mentioned chip select signal, write control signal, etc. has been omitted for purposes of simplification.

FIG. 2 shows the conventional write circuit 8 of FIG. 1 which is constructed by the combination of bipolar elements and MOS transistors, and is disclosed in Japanese Patent Application Laid-Open No. 58193/81. Character $d_1$ denotes a write signal, and $\widetilde{WE}$ denotes a write control signal. This construction incorporates constant current circuits CI1, CI2 to define the level of output signals WC, $\widetilde{WC}$, and so implies such a write circuit as always involving power consumption.

SUMMARY OF THE INVENTION

An object of this invention is to provide a write circuit for a semiconductor storage device, which is capable of implementing low power consumption therein.

In order to attain this object, in accordance with this invention, there is provided a write circuit for a semiconductor storage device in which bipolar transistors and MOS transistors are arranged to form a data output stage constructed by a composite circuit including at least one MOS transistor logic circuit and bipolar transistors. The MOS transistor circuit operates in response to an input signal to control the on-off states of at least one of said bipolar transistor.

In a preferred embodiment of this invention, the above composite circuit comprises a first bipolar transistor with its collector of one conductivity type connected with a first electric potential and its emitter of one conductivity type connected with an output, a second bipolar transistor with its collector of one conductivity type connected with the output and its emitter of one conductivity type connected with a second electric potential, a first MOS transistor circuit arranged between the base and collector of the first bipolar transistor which has the same circuit form as the MOS transistor circuit of the other conductivity type in the complementary MOS transistor logic circuits, and a second MOS transistor circuit arranged between the base and collector of the second bipolar transistor which has the same circuit form as the MOS transistor circuit of one conductivity type in the complementary MOS transistor logic circuits, and the first and second MOS transistor circuits are supplied with the same input as the corresponding MOS transistor circuits in the complementary transistor logic circuits.

In a preferred embodiment of this invention, means for preventing the saturation of a sense circuit is also provided.

Incidentally, the above complementary MOS transistor logic circuit may be an ordinary circuit such as an inverter circuit as shown in FIG. 6a, an NAND circuit including a two-input NAND circuit as shown in FIG. 6b, and an NOR circuit including a two-input NOR circuit as shown in FIG. 6c. In FIGS. 6a–6c, numerals 101, 102, 103, 104, 105 designate P-channel insulated gate field transistors (also referred to as P-channel metal-oxide-semiconductor field effect transistors and abbreviated herein at pMOS), and numerals 106, 107, 108, 109, 110 designate n-channel insulated gate field effect transistors (also referred to as n-channel metal-oxide-semiconductor field effect transistos and abbreviated herein at nMOS).

The above and other objects and features of this invention will become apparent from the following description of embodiments taken in conjunction with the accompanying drawings, in which like reference characters refer to like elements, in the several views.

BRIEF DESCRIPTION OF THE DRAWINGS

FIG. is a circuit diagram of the write circuit according to the other embodiment of this invention.

DESCRIPTION OF THE PREFERRED EMBODIMENTS

Figure 1:
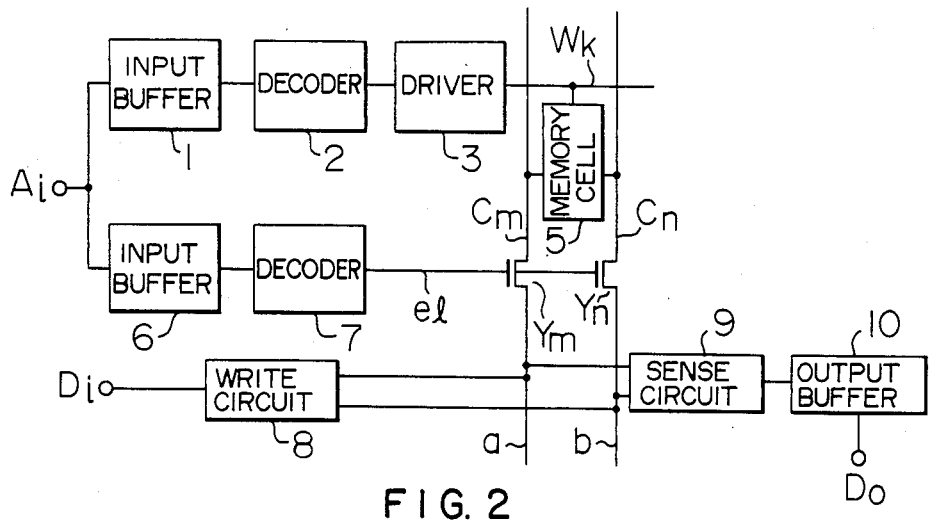
FIG. 1 is a block diagram of an entire memory construction.
Figure 2:
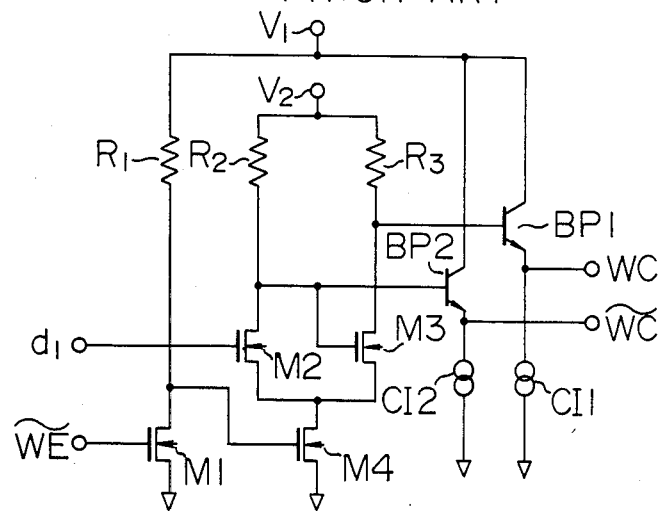
FIG. 2 is a circuit diagram of the conventional write circuit consisting of bipolar elements and MOS transistors.
Figure 3:
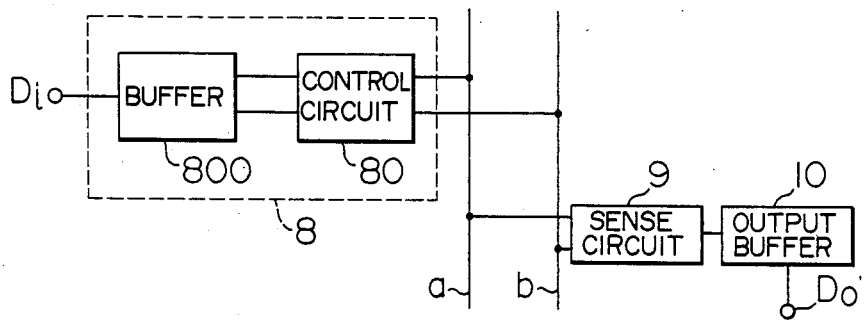
FIG. 3 is a block diagram of a write circuit according to this invention and a sense circuit.

Referring now to the drawing and more particularly to FIG. 3, there is shown a schematic construction of common data lines a, b, a sense circuit 9, and output circuit 10 including a write circuit 8 according to this invention. In the figure, $D_i$ is a write signal, and 800 is a buffer circuit for the write signal, which is a circuit not involving power consumption unlike the conventional circuit. This buffer circuit is constructed by the combination of bipolar elements and MOS transistors, in which an output stage for preventing power consumption constitutes a totem-pole type of bipolar element arrangement. 80 is a control circuit for obviating any operational inconvenience, between the write buffer circuit 800 and the common data lines a, b. In the LSI circuit in which bipolar elements and MOS transistors are mixedly arranged, it is more advantageous to construct the sense circuit 9 using bipolar elements than using MOS transistor with respect to operational speed and sensitivity. When using bipolar elements, however, means for preventing the saturation of the sense circuit during the write operation must be provided. This control circuit 80 provides for this purpose.

Figure 4:
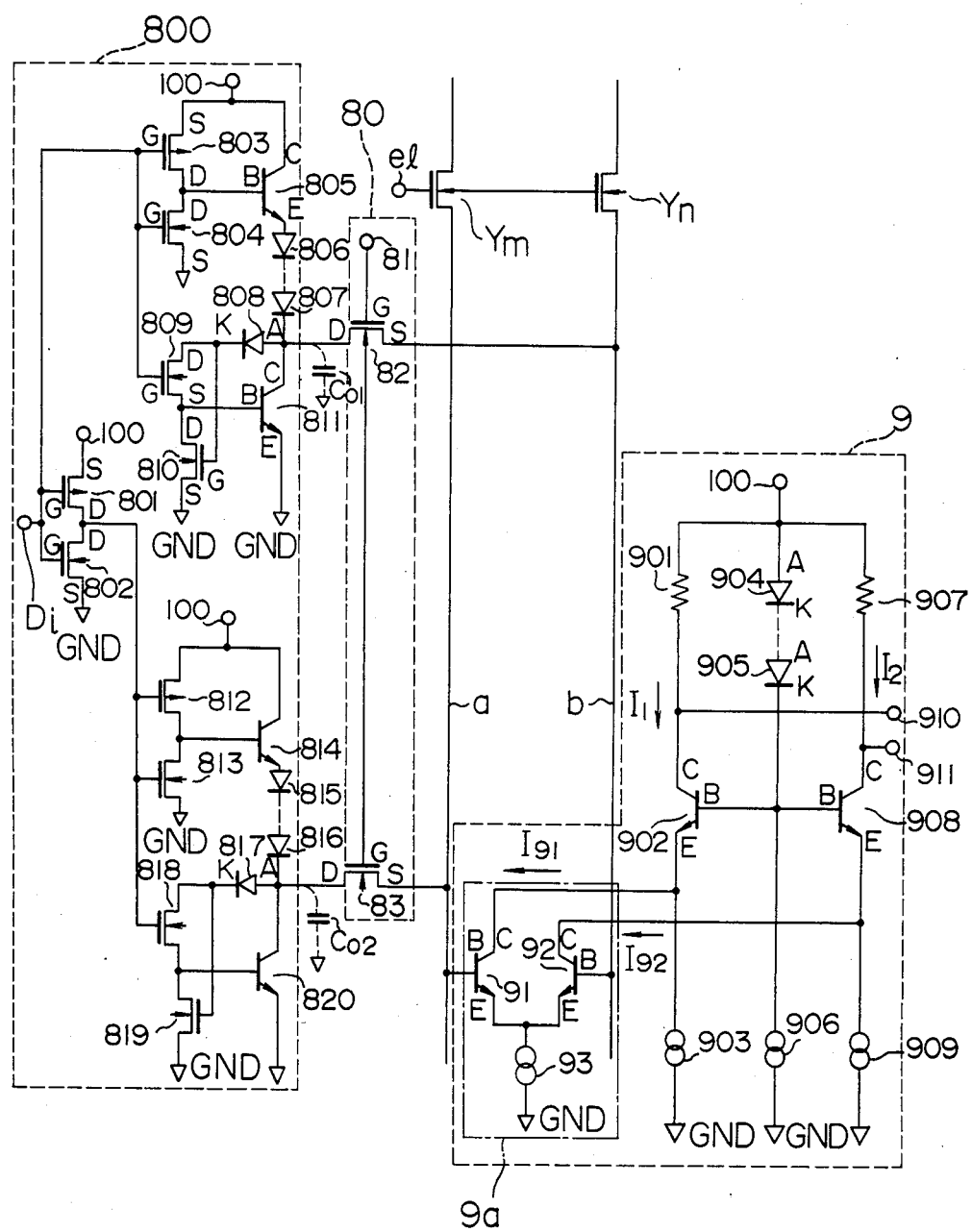
FIG. 4 is a circuit diagram of the write circuit according to one embodiment of this invention.

FIG. 4 shows concrete constructions of the buffer circuit 80 and the control circuit 800 as shown in FIG. 3 according to one embodiment of this invention.

801-820 are semiconductor elements constituting the buffer circuit 800 of the write circuit 80. The buffer circuit 800 comprises two circuits of the same construction since the common data lines a, b are supplied with the signals inverted from each other for the construction of the memory cells in the memory. Namely, 803-811 and 812-820 constitute the same construction, respectively.

801 is a pMOS with its source terminal S connected with a power supply anode terminal 100 and its gate terminal connected with the write signal input terminal $D_i$, 802 is an nMOS with its drain terminal D connected with the drain terminal D of the pMOS 801, its gate terminal G connected with the write signal input terminal $D_1$ and its source terminal S connected with a power supply cathode terminal GND. The pMOS 801 and nMOS constitutes a C (Complementary) MOS inverter circuit which produces a signal inverted from the write signal $D_i$. The semiconductor elements 803-811 and 812-820 constitute two inverters of the same construction, one input signal to which is provided at the write signal $D_1$ terminal and the other input signal to which is provided from the invertion of the write signal $D_1$. Hereinafter, explanation will be made on the function of the inverter with respect to the construction of the elements 803-811.

Figure 6A:
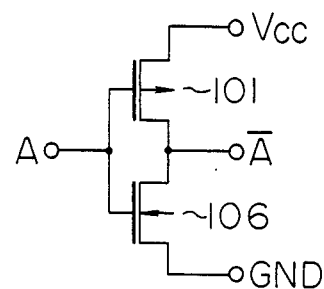
FIG. 6a, 6b and 6c l are circuit diagrams of examples of the well-known complementary MOS transistor logic circuit.

803 is a pMOS with its source terminal S connected with a power supply anote terminal 100, and its gate terminal G connected with the input terminal $D_1$, which has the same circuit form as the pMOS 101 in the CMOS inverter circuit as shown in FIG. 6a. 804 is nMOS with its drain terminal D connected with the drain terminal D of the pMOS 803, its gate terminal connected with the input terminal $D_i$, and its source terminal S connected with a power supply cathode terminal, which has the same circuit form as the nMOS 106 in the CMOS inverter circuit as shown in FIG. 6a. 805 is a first npn bipolar transistor with its collector terminal C connected with the power supply anode terminal 100 and its base terminal B connected with the drain terminal of the pMOS 803. 806, 807 are N diodes for preventing the saturation of the sense circuit 9. 808 is a diode with its anode terminal A connected with the cathode terminal of the diode 807. 809 is an nMOS with its drain terminal connected with the cathode terminal K of the diode 808 and its gate terminal G connected with the input terminal $D_1$, which has the same circuit form as the nMOS 106 in the CMOS inverter as shown in FIG. 6a. 801 is an nMOS with its drain terminal connected with the source terminal of the nMOS 809, its gate terminal G connected with the cathode terminal K of the diode 808 so as to respond to the output from the CMOS inverter circuit consisting of the pMOS 803 and the nMOS 804, and its source terminal connected with a power supply cathode terminal GND. 811 is a second npn bipolar transistor with its collector terminal C connected with the anode terminal A of the diode 808, its base terminal B connected with the drain terminal D of the nMOS 810, and its emitter terminal E connected with power supply cathode GND. The first and second npn bipolar transistors 805, 811 constitute a data output stage of the write circuit 8.

The operation of the above construction will be as follows.

When the input terminal signal is in a "High" level the nMOS's 804, 809 are turned on. Then, the base storing charge of the first npn transistor is discharged through the nMOS 804. When the anode terminal A of the diode 808 is in the "High" level, the charge which has been stored in the load capacitor $C_{01}$ at the anode terminal D of the diode 808 is discharged the diode 808, the nMOS 809, and the base-emitter of the second npn transistor 811 towards the power supply cathode terminal GND. Thus, the anode terminal of the diode 808 becomes in a "Low" level. In the above arrangement, the second npn transistor 811 does not carry out a saturation operation because of the presence of the nMOS 809.

When the input terminal signal $D_i$ is in the "Low" level, current flows through the pMOS 803 into the base terminal B of the first npn transistor 805. Thus, the first npn transistor is turned on, and accordingly the anode terminal A of the diode 808 is charged. The charging voltage $V_{C01}$ at this time is substantially, assuming that the voltage at the power supply anode terminal 100 is $V_{CC}$, $$V_{C01} = V_{CC} = (N+1)V_{BE} \qquad (1)$$

where $V_{BE}$ represents the base-emitter voltage of the first npn transistor 805 and the foward voltage drop across the N diodes 806, 807. Therefore, $V_{C01}$ can be defined as required by altering the number of N. This $V_{C01}$ is set so that the sense circuit 9 is not saturated, as will be described later.

In this state, the voltage at the cathode terminal K of the diode 808 is $$V_{C01} - (N+2)V_{BE} \qquad (2)$$

This voltage is applied to the gate terminal G of the nMOS 810 thereby to turn the nMOS 810 on. Thus, the base storing charge of the second npn transistor 811 is discharged. Accordingly, the inverter circuit consisting of the elements 803–811 does not consume in its steady state like the CMOS inverter.

The above mentioned construction and operation applies in the inverter consisting of the elements 812–820.

Semiconductor elements 81–83 constitute a control circuit 80.

81 is a control signal terminal for turning on the control circuit 80; 82 is an nMOS with its drain terminal connected with the anode terminal of the diode 808, its gate terminal G connected with the control signal terminal 81 and its source terminal S connected with the one common data line b; and 83 is an nMOS with its drain terminal connected with the anode terminal A of the diode, its gate terminal G connected with the control signal terminal and its source terminal S connected with the other common data line a.

The control circuit 80 is in the conduction state, with the control signal terminal 81 being in the "High" level, and transmits the voltages at the anode terminal of the diodes 808, 817 to the common data lines a, b. The voltages at the output terminals of the diodes 808, 817 are signals such as inverted from each other so that the signals on the common data lines a, b are also such as inverted from each other. Only either one of the totempole arrangements consisting of the npn transistors 805, 811 and of the npn transistors 814, 820 is turned on, so that current does not always flow, which reduces current consumption.

Semiconductor elements 91–93 and 901–909 constitute the sense circuit 9.

The semiconductor element 91–93 constitute a differential stage 9a in which 91 is an npn transistor with its base terminal B connected with the common data line a; 92 is an npn transistor with its base terminal B connected with the common data line b and its emitter terminal E connected with the emitter terminal E of the npn transistor 91; and 93 is a constant current circuit connected with the respective emitter terminals of the npn transistors 91, 92.

This stage is an ordinary differential stage in which the voltage between the common data lines a, b varies the collector currents in the npn transistors 91, 92 and the sum of these collector currents is equal to the constant current value of the constant current circuit 93.

The semiconductor elements 901–909 constitute a cascode amplifier stage together with the differential stage 9a.

901 is a resistor with its one terminal connected with the power supply anode terminal 100; 902 is an npn transistor with its collector terminal C connected with the other terminal of the resistor 901 and its emitter terminal E connected with the collector terminal C of the npn transistor 91; 903 is a constant current circuit connected with the emitter terminal E of the npn transistor 902; 904 is a diode with its anode terminal connected with the power supply anode terminal 100; and 905 is a diode connected in the stage N stage lower than the diode 904. 904–905 constitute an N stage diode array. 906 is a constant current circuit connected with the cathode terminal K of the diode 905 and the base terminal of the npn transistor 902; 907 is a resistor with one terminal connected with the power supply anode terminal 100; 908 is an npn transistor with its collector terminal C connected with the other terminal of the resistor 907, its base terminal connected with the base terminal of the npn transistor 902 and its emitter terminal E connected with the collector terminal C of the npn transistor 92; and 909 is a constant current circuit connected with the emitter terminal E of the npn transistor 908. 910 is an output terminal connected with the collector terminal C of the npn transistor 902; 911 is an output terminal connected with the collector terminal of the npn transistor 908.

The above arrangement consisting of the elements 901–909 will be as follows.

When the potential on the common data line a is higher than that on the common data line b, the collector current $I_{91}$ of the npn transistor 91 is greater than the collector current $I_{92}$ of the npn transistor 92, and the collector current $I_1$ of the npn transistor 902 constitutes the sum of $I_{91}$ and the constant current value of the constant current circuit 903. $I_1$ is defined by the base current in the npn transistor 902, which flows due to the base voltage thereof ($V_{CC} - NV_{BE}$) determined by the constant current value of the constant current circuit and the diodes 904–905. Then, the output voltage at the output terminal 910 is reduced from the voltage $V_{CC}$ of the power supply anode terminal 100 by the potential decided by the resistance of the resistor 901 and the current $I_1$. On the other hand, as for the output signal at the output terminal 911, the voltage between $V_{CC}$ and the potential determined by the resistance of the resistor 907 and the current $I_2$ in the npn transistor 908 is small since this current $I_2$ is small.

When the potential relation between the common data lines a, b is inverted, the above operation and the output signals at the output terminals 910, 911 are also inverted.

The relation between the common data lines in potential value can be detected by the above operations.

In the above arrangement relative to the control circuit 80 and sense circuit 9, at the time of data writing, the data is written with the nMOS's 82, 83 on while at the time of data reading, the signal is detected in the sense circuit 9 with the nMOS's 82, 83 off. In the above arrangement, with respect to the potentials on the common data lines a, b at the time of data writing, the potential at the higher side thereof is such as represented by equation (1), and the collector potentials of the npn transistors 91, 92 in the differential stage are also $V_{CC} - (N+1) V_{BE}$ like equation (1). Therefore, the npn transistors 91, 92 are not saturated in favor of the presence of N diodes of 806, 807. Accordingly, high speed repetition of read/write does not require the retardation of reading speed.

The following advantages are obtained from one embodiment of this invention.

(1) The implementation of the totem-pole arrangements in the write signal buffer circuit 800 such as the combinations of 805 and 811, and of 814 and 820, in the write circuit constructed by the combination of bipolar transistors and MOS transistors permits the write circuit with large driving capacity and small current consumption to be constructed.

(2) The differential stage 9a in the sense circuit is constructed by bipolar elements in such a way that the bipolar elements are prevented from being saturated by N diodes 806, 807, so that high speed repetition of write/read can be carried out.

Figure 5:
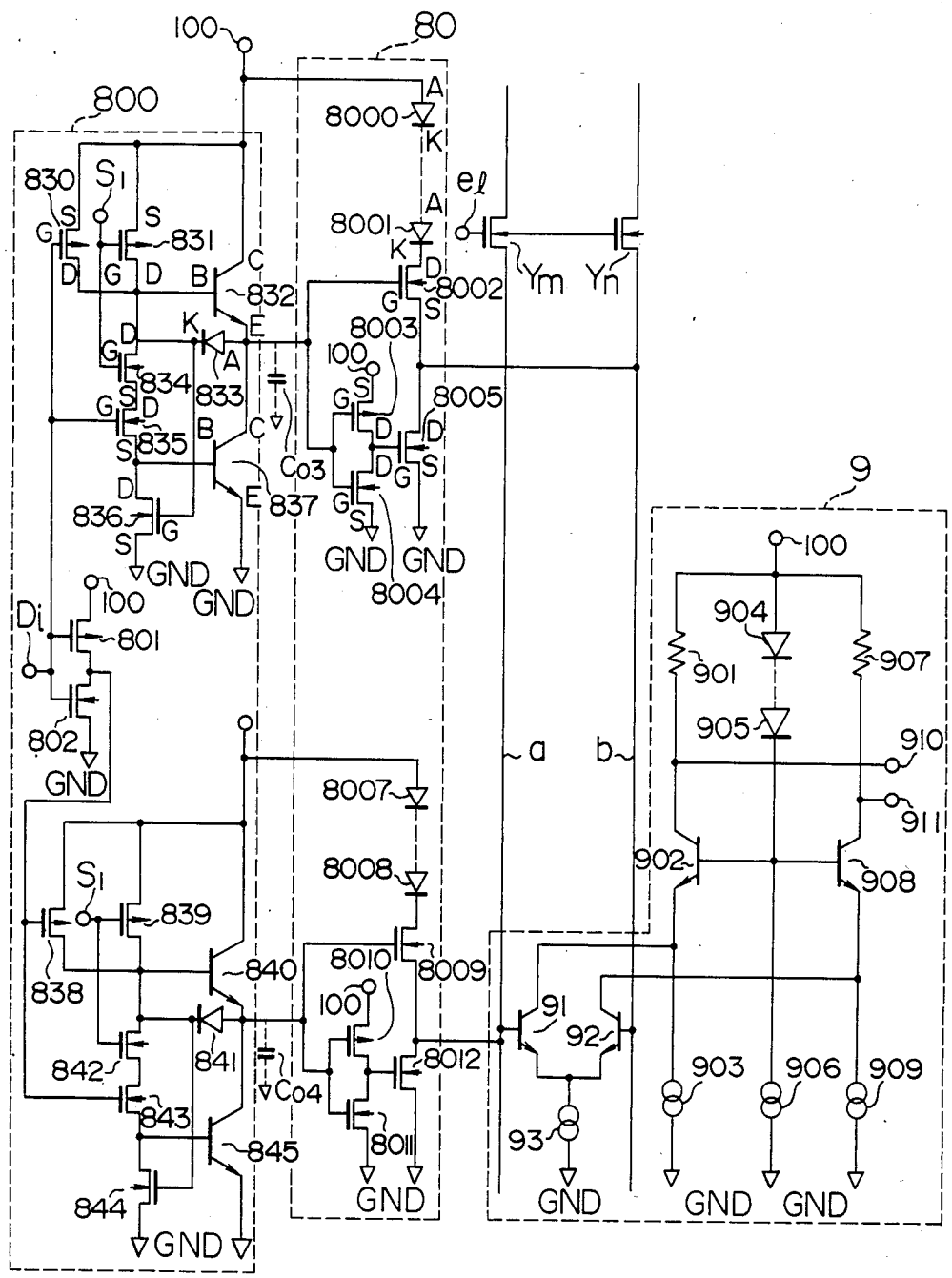

The other embodiment of this invention is shown in FIG. 5.

As the group of the semiconductor elements 803–811, 82 and the group of the semiconductor elements 812–820, 83 are identical to each other in the construction, as described above, the group of semiconductor elements 830–837, 8000–8005 and the group of semiconductor elements 838–845, 8007–8012 are also identical to each other in the construction and produce signals inverted from each other. The semiconductor elements 830–837 and 838–845 constitute a two input NAND circuit, respectively. One input signal to each NAND circuit is $D_i$ for one NAND circuit and is the inversion of $D_i$ for the other NAND circuit, as described above. Hereinafter, explanation will be made on the function of such an arrangement with respect to the semiconductor elements 830–837, 8000–8005.

Figure 6B:
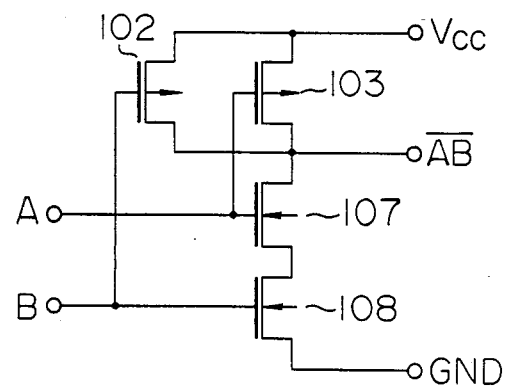
Figure 6C:
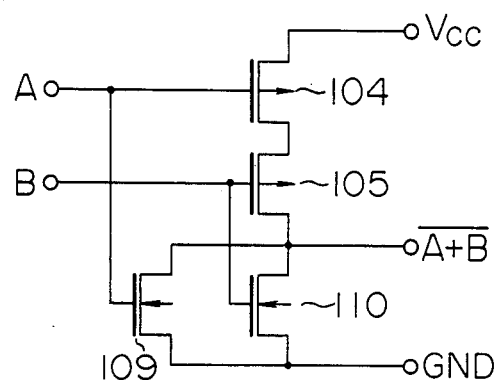

830 is a pMOS with its source terminal S connected with the power supply anode terminal 100 and its gate terminal G connected with the input signal $D_i$, 831 is a pMOS with its source terminal S connected with the power supply anode terminal 100, its gate terminal G connected with the control signal S, including a write control signal, chip select signal, etc., and its drain terminal D connected with the drain terminal D of the pMOS 830. A parallel circuit consisting of the pMOS's 830 and 831 constitute the same circuit form as the parallel circuit of the pMOS's 102 and 103 in the CMOS two input NAND circuit as shown in FIG. 6b. 832 is a first npn transistor with its collector connected with the power supply anode terminal 100 and its base terminal B connected with the drain terminals of the pMOS's 830, 831; 833 is a unidirectional element diode with its anode terminal A connected with the emitter terminal E of the first npn transistor 832. The rectification direction of the diode 833 is opposite to that of the pn junction formed by the base and emitter terminals of the first npn transistor. 834 is an nMOS with its drain terminal D connected with the drain terminal D of the pMOS 831 and the cathode terminal K of the diode 833 and its gate terminal G connected with the control signal $S_1$; 835 is an nMOS with its drain terminal D connected with the source terminal S of the nMOS 834 and its gate terminal G connected with the input signal $D_1$. A series circuit consisting of the nMOS's 834 and 835 constitutes the same as the series circuit consisting of the nMOS's 107 and 108 in the CMOS two input NAND circuit as shown in FIG. 6b. 836 is an nMOS with its drain terminal D connected with the source terminal S of the nMOS 835, its gate terminal G connected with the cathode terminal K of the diode 833 so as to respond to the outputs from the pMOS's 830, 831 and its source terminal connected with the power supply cathode terminal GND; and 837 is a second npn transistor with its collector terminal C connected with the emitter terminal E of the first npn transistor 832, its base terminal B connected with the drain terminal D of the nMOS 836 and its emitter terminal E connected with the power supply cathode terminal GND.

The operation of the above arrangement will be as follows.

When the control signal $S_1$ is in a "Low" level, the pMOS 831 is alway in the on state and the nMOS 834 is alway in the off state, so that the anode terminal of the diode 833 becomes in a "High" level, and a load capacitor $C_{03}$ is always charged to the "High" level.

When the input signal $D_i$ becomes in the "High" level, with the control signal $S_i$ being in the "High" level, the charge of the load capacitor $C_{03}$, when it is in the "High" level, is discharged through the diode 833, the nMOS's 834, 835 and the second npn transistor 837.

On the other hand, when the input signal $D_i$ becomes in the "Low" level, the nMOS 835 is turned off so that the charge of the load capacitor $C_{03}$ is not discharged, with its state unchanged.

As understood from the foregoing explanation, the two input NAND circuit composed of the semiconductor elements 830–837 does not consume power so much in its steady state because of its totem-pole arrangement.

The arrangement composed of the semiconductor elements 8000–8005 is as such described below.

8000 is a diode with its anode terminal A connected with the power supply anode terminal 100; 8001 is a (N+1)th stage diode connected with the diode 8000; 8002 is an nMOS with its drain terminal D connected with the cathode terminal K of the diode 8001 and its gate terminal G connected with the collector terminal connected with the second npn transistor 837; 8003 is a pMOS with its source terminal S connected with the power supply anode terminal 100 and its gate terminal G connected with the collector terminal C of the second npn transistor; 8004 is an nMOS with its drain terminal D connected with the drain terminal D of the pMOS 8003, its gate terminal G connected with the collector terminal C of the npn transistor 837 and its source terminal S connected with the power supply cathode terminal GND; and 8005 is an nMOS with its drain terminal D connected with the source terminal S, its gate terminal G connected with the drain terminal D of the pMOS 8003 and its source terminal S connected with the power supply cathode terminal GND. The drain terminal D of the nMOS 8005 is also connected with the common data line b.

When the charge of the load capacitor $C_{03}$ is in the "Low" level at the time of writing, the nMOS's 8002, 8004 are in off state, and the pMOS 8003 is in the on state, so that the nMOS 8005 becomes in the on state and the common data line b becomes in the "Low" level. Therefore, current does not flow continuously during the data writing so that current consumption is not increased.

On the other hand, when the load capacitor $C_{03}$ is in the "High" level at the time of writing, the nMOS 8002 is in the on state so that the common data line b becomes in the "High" level. Then, the voltage level of the common data line b is clamped to the value reduced from the voltage $V_{CC}$ at the power supply anode terminal by $(N+1)\,V_{BE}$. This voltage, as described above, does not saturate the differential stage 9a of the sense circuit 9.

The above mentioned arrangement does not allow the presence of current path continuously flowing through the write circuit and is capable of preventing the saturation of the sense circuit 9. These advantages imply the achievement of both the implementaion of totem-pole and means of preventing the saturation in the write circuit 8.

Incidentally, abthough the explanation about this invention has been made taking, as an example, the inverter circuits of 803–811 and 812–820 in FIG. 4 and the two input NAND circuits of 830–837 and 838–845 in FIG. 5, this can also be apapted to a k input NAND circuit such as three input NAND circuit and four input NAND circuit, or a composite circuit consisting of bipolar transistors and complementary MOS transistors such as a k input NOR circuit.

As described above, in accordance with this invention, there is provided a write circuit for a semiconductor storage device, which can implement less power consumption.

We claim:

1. A write circuit for a semiconductor storage device, said write circuit comprising a data output stage constructed by a composite circuit including:
   an output circuit including a pair of first and second bipolar transistors, each having a collector, a base, and an emitter, wherein collector-emitter current paths of said pair of bipolar transistors are connected in series to each other between first and second electric potentials, and wherein a connection node of said collector-emitter current paths provides an output of the composite circuit; and
   an input circuit including a MOS transistor which is responsive to a predetermined input to output a signal for rendering said first bipolar transistor in the on or off state, and wherein said input circuit is further responsive to said predetermined input to output another signal for rendering said second bipolar transistor in the on or off state in an opposite relation to the on-off state of said first bipolar transistor.

2. A write circuit for a semiconductor storage device according to claim 1, in which said input circuit further includes another MOS transistor responsive to said predetermined input to output another signal for rendering said second bipolar transistor in the on or off state in an opposite relation to the on-off state of said first bipolar transistor.

3. A write circuit for a semiconductor storage device, said write circuit comprising a data output stage constructed by a composite circuit including:
   an output circuit including a pair of first and second bipolar transistors, each having a collector, a base, and an emitter, and wherein collector-emitter current paths of said pair of bipolar transistors are connected in series to each other between first and second electric potentials, and wherein a connection node of said collector-emitter current paths provides an output of the composite circuit; and
   an input circuit including a MOS transistor, wherein said circuit is responsive to a predetermined input to output a signal for rendering said first bipolar transistor in the on or off state, and further wherein said MOS transistor is further responsive to said predetermined input to output another signal for rendering said second bipolar transistor in the on or off state in an opposite relation to the on-off state of said first bipolar transistor.

4. A write circuit for a semiconductor storage device according to claim 3, in which said input circuit further includes another MOS transistor responsive to said predetermined input to output said signal for rendering said first bipolar transistor in the on or off state.

5. A write circuit for a semiconductor storage device, comprising:
   a data output stage constructed by a composite circuit including an output circuit including a bipolar transistor having a collector, a base, and an emitter, and wherein either of said collector and said emitter provides an output of the composite circuit;
   an input circuit including a MOS transistor which is responsive to a predetermined input to output a signal for rendering said bipolar transistor in the on or off state; and
   means for preventing the saturation of a sense circuit which is coupled to sense an output from said semiconductor storage device.

6. A write circuit for a semiconductor storage device according to claim 1, in which said composite circuit further comprises:
   said pair of first and second bipolar transistors each having a collector of the first conductivity type, a base of the second conductivity type, and an emitter of the first conductivity type; and
   said input circuit including:
      a first MOS transistor having a channel of the second conductivity type responsive to said predetermined input for forming a current path from said first potential to the base of said first bipolar transistor to output said signal for rendering said first bipolar transistor in the on or off state, and
      a second MOS transistor having a channel of the first conductivity type responsive to said predetermined input for forming a current path from at least said output of the composite circuit to the base of said second bipolar transistor to output another signal for rendering said second bipolar transistor in the on or off state in an opposite relation to the on-off state of said first bipolar transistor.

7. A write circuit for a semiconductor storage device according to claim 1, in which said composite circuit further comprises:
   a first discharge means for discharging accumulated charges from at least said first bipolar transistor to said second potential, when said first bipolar transistor is switched from the on-state to the off-state; and
   a second discharge means for discharging accumulated charges from at least said second bipolar transistor to said second potential when said second bipolar transistor is switched from the on-state to the off-state.

8. A write circuit for a semiconductor storage device according to claim 7, in which said first discharge means includes a third MOS transistor having a channel of the first conductivity type responsive to said predetermined input for forming a current path from the base of said first bipolar transistor to said second potential.

9. A write circuit for a semiconductor storage device according to claim 7, in which said second discharge means includes a fourth MOS transistor having a channel of the first conductivity type switched into an on state when said first bipolar transistor is on, for forming a current path from the base of said second bipolar transistor to said second potential, and switched into an off state when said first bipolar transistor is off.

10. A write circuit for a semiconductor storage device according to claim 9, in which said fourth MOS transistor has its gate connected to said output of the composite circuit, and its drain and source connected to the base of said second bipolar transistor and said second potential.

11. A write circuit for a semiconductor storage device according to claim 6, in which said composite circuit further comprises a unidirectional element for forming a current path from said output of the composite circuit to the base of said second bipolar transistor through said second MOS transistor, and for blocking a current path from the base of said first bipolar transistor to said output of the composite circuit.

12. A write circuit for a semiconductor storage device according to claim 11, in which said unidirectional element is a diode with the anode thereof connected to said output of the composite circuit, and the cathode thereof connected to the base of said first bipolar transistor.

13. A write circuit for a semiconductor storage device according to claim 1, in which said emitter of said first bipolar transistor is connected with said output of the composite circuit through a diode.

14. A write circuit for a semiconductor storage device according to claim 10, in which the gate of said fourth MOS transistor is connected to said output of the composite circuit through a diode.

15. A write circuit for a semiconductor storage device according to claim 3, in which said composite circuit further comprises:

said pair of first and second bipolar transistors each having a collector of the first conductivity type, a base of the second conductivity type, and an emitter of the first conductivity type; and said input circuit including:

a first MOS transistor having a channel of the second conductivity type responsive to said predetermined input for forming a current path from said first potential to the base of said first bipolar transistor to output said signal for rendering said first bipolar transistor in the on or off state, and a second MOS transistor having a channel of the first conductivity type responsive to said predetermined input for forming a current path from at least said output of the composite circuit to the base of said second bipolar transistor to output another signal for rendering said second bipolar transistor in the on or off state in an opposite relation to the on-off state of said first bipolar transistor.

16. A write circuit for a semiconductor storage device according to claim 3, in which said composite circuit further comprises:

a first discharge means for discharging accumulated charges from at least said first bipolar transistor to said second potential, when said first bipolar transistor is switched from the on-state to the off-state; and a second discharge means for discharging accumulated charges from at least said second bipolar transistor to said second potential when said second bipolar transistor is switched from the on-state to the off-state.

17. A write circuit for a semiconductor storage device according to claim 16, in which said first discharge means includes a third MOS transistor having a channel of the first conductivity type responsive to said predetermined input for forming a current path from the base of said first bipolar transistor to said second potential.

18. A write circuit for a semiconductor storage device according to claim 16, in which said second discharge means includes a fourth MOS transistor having a channel of the first conductivity type switched into an on state when said first bipolar transistor is on, for forming a current path from the base of said second bipolar transistor to said second potential, and switched into an off state when said first bipolar transistor is off.

19. A write circuit for a semiconductor storage device according to claim 18, in which said fourth MOS transistor has its gate connected to said output of the composite circuit, and its drain and source connected to the base of said second bipolar transistor and said second potential.

20. A write circuit for a semiconductor storage device according to claim 15, in which said composite circuit further comprises a unidirectional element for forming a current path from said output of the composite circuit to the base of said second bipolar transistor through said second MOS transistor, and for blocking a current path from the base of said first bipolar transistor to said output of the composite circuit.

21. A write circuit for a semiconductor storage device according to claim 20, in which said unidirectional element is a diode with the anode thereof connected to said output of the composite circuit, and the cathode thereof connected to the base of said first bipolar transistor.

22. A write circuit for a semiconductor storage device according to claim 3, in which said emitter of said first bipolar transistor is connected with said output of the composite circuit through a diode.

23. A write circuit for a semiconductor storage device according to claim 19, in which the gate of said fourth MOS transistor is connected to said output of the composite circuit through a diode.

* * * * *